United States Patent
Yang et al.

(10) Patent No.: US 7,061,117 B2
(45) Date of Patent: Jun. 13, 2006

(54) BUMP LAYOUT ON SILICON CHIP

(75) Inventors: Wen-Chih Yang, Hsinchu Hsien (TW); Feng-Cheng Su, Hsinchu Hsien (TW); Chin-Chen Yang, Hsinchu Hsien (TW)

(73) Assignee: Au Optronics Corporation, Hsinchu (TW)

( * ) Notice: Subject to any disclaimer, the term of this patent is extended or adjusted under 35 U.S.C. 154(b) by 201 days.

(21) Appl. No.: 10/708,665

(22) Filed: Mar. 18, 2004

(65) Prior Publication Data

US 2004/0169291 A1 Sep. 2, 2004

Related U.S. Application Data

(62) Division of application No. 10/064,575, filed on Jul. 29, 2002, now abandoned.

(30) Foreign Application Priority Data

Aug. 6, 2001 (TW) ................................. 90119108 A

(51) Int. Cl.
- *H01L 23/48* (2006.01)
- *H01L 23/52* (2006.01)
- *H01L 29/40* (2006.01)

(52) U.S. Cl. ...................... 257/773; 257/786

(58) Field of Classification Search ............... None
See application file for complete search history.

(56) References Cited

U.S. PATENT DOCUMENTS

| | | | |
|---|---|---|---|
| 6,049,136 A * | 4/2000 | Humphrey et al. | 257/786 |
| 6,388,890 B1 * | 5/2002 | Kwong et al. | 361/780 |
| 6,400,019 B1 * | 6/2002 | Hirashima et al. | 257/737 |
| 6,750,552 B1 * | 6/2004 | Narayanan | 257/786 |
| 6,756,666 B1 * | 6/2004 | Hosomi | 257/693 |
| 6,756,686 B1 * | 6/2004 | Iwasaki et al. | 257/778 |
| 6,777,815 B1 * | 8/2004 | Huang | 257/778 |
| 6,940,093 B1 * | 9/2005 | Eldridge et al. | 257/48 |
| 6,946,732 B1 * | 9/2005 | Akram et al. | 257/730 |

\* cited by examiner

Primary Examiner—David A. Zarneke
(74) Attorney, Agent, or Firm—Jianq Chyun IP Office

(57) ABSTRACT

A bump layout on the active region of a driver IC for increasing overall bump count. The layout fits IC packages that have a narrow and long body profile. Bumps are positioned close to the long side and central regions of the active region so that low marking pressure on the shorter sides of the package during chip-glass bondage is avoided. Dummy bumps may also be positioned close to the shorter sides of the package so that pressure distribution is optimized during chip-glass bondage.

6 Claims, 3 Drawing Sheets

BUMP LAYOUT ON SILICON CHIP

CROSS REFERENCE TO RELATED APPLICATIONS

This application is a divisional of a prior application Ser. No. 10/064,575, filed Jul. 29, 2002 now abandoned, which the priority benefit of Taiwan application serial no. 90119108, filed on Aug. 6, 2001.

BACKGROUND OF INVENTION

1. Field of Invention

The present invention relates to a bump layout on a silicon chip. More particularly, the present invention relates to a bump layout on a silicon chip such that pressure is distributed evenly to each bump and maximum permissible pitch is retained between the edges of neighboring bumps to reduce the probability of a short circuit.

2. Description of Related Art

Due to rapid progress in semiconductor device and display device fabrication, multi-media communication is becoming increasingly popular. Although cathode ray tube (CRT) displays can provide relatively high image quality at a low cost, thin film transistor (TFT) liquid crystal display (LCD) devices are gradually replacing CRTs because the TFT LCD is thinner and consumes less power. However, aside from a liquid crystal display panel, a LCD display also needs a driver IC to drive the display panel. In recent years, the demand to display a huge volume of data has jacked up the total number of input/output (I/O) terminals needed on a liquid crystal panel driver. For example, a driver IC having 308, 309, 384 or even 420 input/output terminals is quite common. In addition, the driver IC must correspond in size with the liquid crystal display panel. Hence, the driver IC often has a rectangular plan so that the number of I/O pads along the edges of the driver IC is maximized. Typically, a driver chip and a liquid crystal display panel are joined together in a chip-on-glass (COG) process, a chip-on-film (COF) process, a chip-on-board (COB) process or a tape-automated-bonding (TAB) process.

In a chip-on-glass (COG) method, the bumps on the driver IC are positioned according to the configuration. In a gate driver IC configuration, the total number of input/output terminals is smaller. However, in a source driver IC configuration, the driver IC has more input/output terminals.

FIG. 1 is a top view showing the bump layout of a conventional LCD driver IC. In general, the bumps 102 of a driver IC 100 of most super-twist-oriented LCD (STN-LCD) or TFT-LCD are arranged as a single row along the edges surrounding the active area of the driver IC 100. In other words, the bumps enclose an area on the driver IC 100 containing a circuit 104.

As shown in FIG. 1, the bumps are principally positioned along the edges of the driver IC with the central region reserved for housing the circuits. Since the bumps are placed along the edge in a single file, the maximum number of bumps that can be laid depends on overall peripheral length of the driver IC, size of each bump and pitch between neighboring bumps. Hence, the only way to increase the number of bumps on the driver IC having this type of layout is to shrink the bumps.

FIG. 2 is a top view showing bump layout of a conventional TFT LCD driver IC. As shown in FIG. 2, the total number of bumps 202 on the driver IC 200 is considerably greater than the total number of bumps 102 on the driver IC 100 shown in FIG. 1. Due to the total number of bumps required on the driver IC 200 and consideration regarding the dimensions of the liquid crystal display, the source driver IC is designed to have a narrow rectangular structure. The central area of the driver IC 200 encloses an active region or a circuit region 204. Bumps 202 close to a first edge 206 on one side of the active region 204 are positioned alternately on two rows. Bumps close to a second edge on the opposite side of the active region 204 are positioned in a single row. Furthermore, bumps 202 close to a first short side 210 and a second short side 212 of the driver IC are positioned in an array format.

The bumps 202 on the conventional source driver IC 200 as shown in FIG. 2 are unevenly distributed. In COG manufacturing, this non-uniform bump layout may produce an uneven stress around the peripheral region of the driver IC 200. Thus, fewer cracks will form close to the short edges 210 and 212 and more cracks will form elsewhere. Ultimately, reliability of the assembled structure is compromised.

SUMMARY OF INVENTION

Accordingly, one object of the present invention is to provide a bump layout that facilitates the placement of more bumps on the active region of a driver IC and the optimization of pressure distribution in chip-on-glass manufacturing. Hence, lighter marks on the shorter sides of a conventional rectangular drive chip are prevented.

To achieve these and other advantages and in accordance with the purpose of the invention, as embodied and broadly described herein, the invention provides a bump layout on a driver IC. The bumps are arranged to form a grid array over the active region of the driver IC. The bumps, for example, may be spread out in a regular array, in alternating non-aligned rows, or a mixture of the two. One principal criterion in the bump layout is to spread out all the bumps as evenly as possible so that equal pressure is conferred to each bump in chip-on-glass manufacturing. Circuits of the driver IC are formed underneath the bump space region, the area between the bumps. Hence, driver IC area is more effectively utilized and the driver IC may include more bumps.

This invention also provides a bump layout on a driver IC. The bumps are laid out in a manner on the driver IC such that no bumps are located over regions with light marking pressure. Since a thin film transistor (TFT) liquid crystal display (LCD) package has a narrow rectangular profile, the driver IC has a first long side, a second long side, a first short side and a second short side. Bumps are positioned over the active area of the driver IC according to a few layout strategies. Bumps close to the first long side of the driver IC package are laid in alternating non-aligned rows. Bumps close to the second long side of the driver IC package are laid in a single row. No bumps are laid in the neighborhood of the first short side or the second short side. Those bumps close to the shorter sides of a conventional driver IC package are shifted towards more central regions so that lighter marking pressure during COG manufacturing is prevented. A few dummy bumps may be introduced into the neighborhood of the shorter sides after moving bumps close to the shorter sides towards the central region. Since the aforementioned bump layout may divide the active region into several circuit blocks, the circuit blocks may be connected with each other by forming special circuit lines.

Dummy bumps may also be introduced close to the first short side and the second short side of the driver IC package so as to balance out the pressure on a source driver IC during COG manufacturing.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
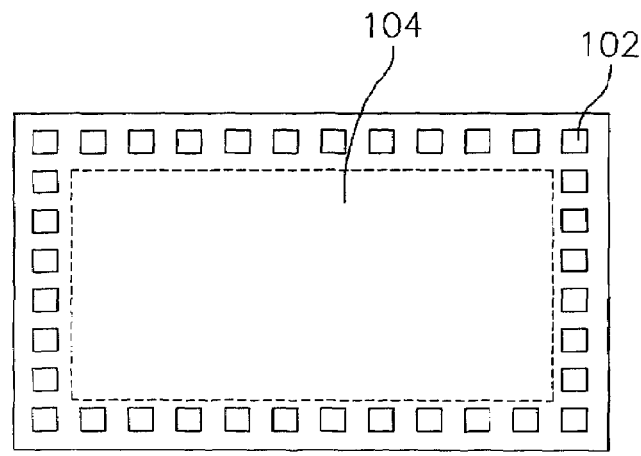
FIG. 1 is a top view showing bump layout of a conventional LCD driver IC.
Figure 2:
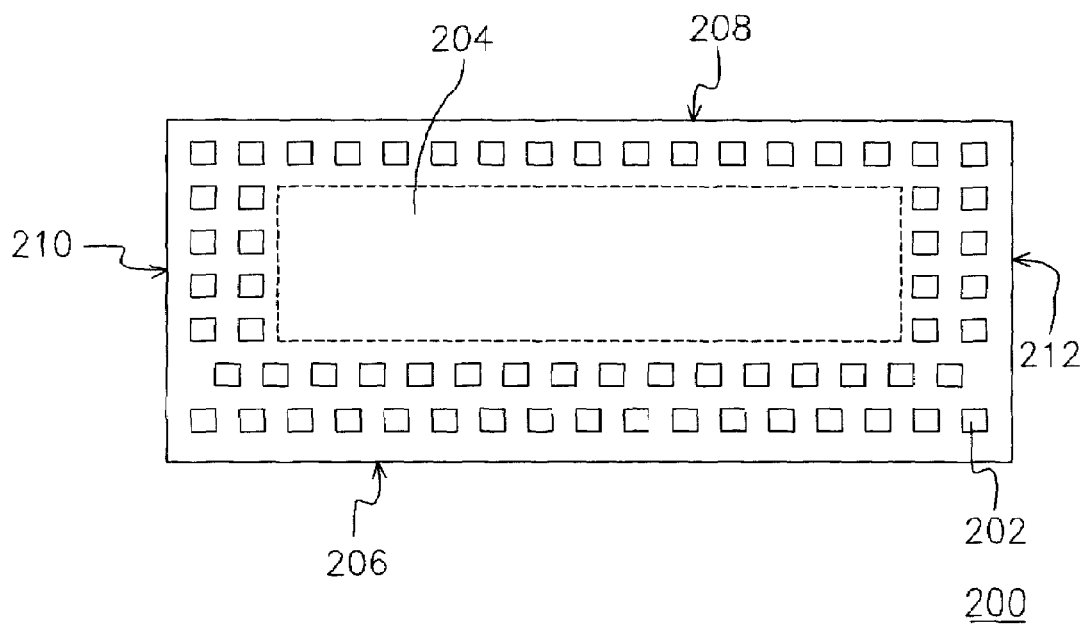
FIG. 2 is a top view showing bump layout of a conventional TFT LCD driver IC.

Reference will now be made in detail to the present preferred embodiments of the invention, examples of which are illustrated in the accompanying drawings. Wherever possible, the same reference numbers are used in the drawings and the description to refer to the same or like parts.

Figure 3:
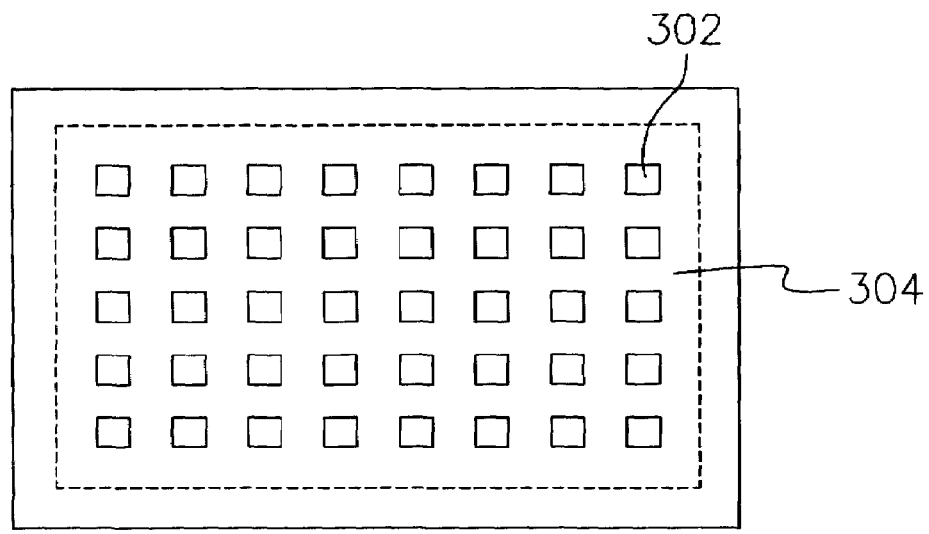
FIGS. 3 and 4 are top views showing two alternative bump layouts of a driver IC according to a first preferred embodiment of this invention.
Figure 4:
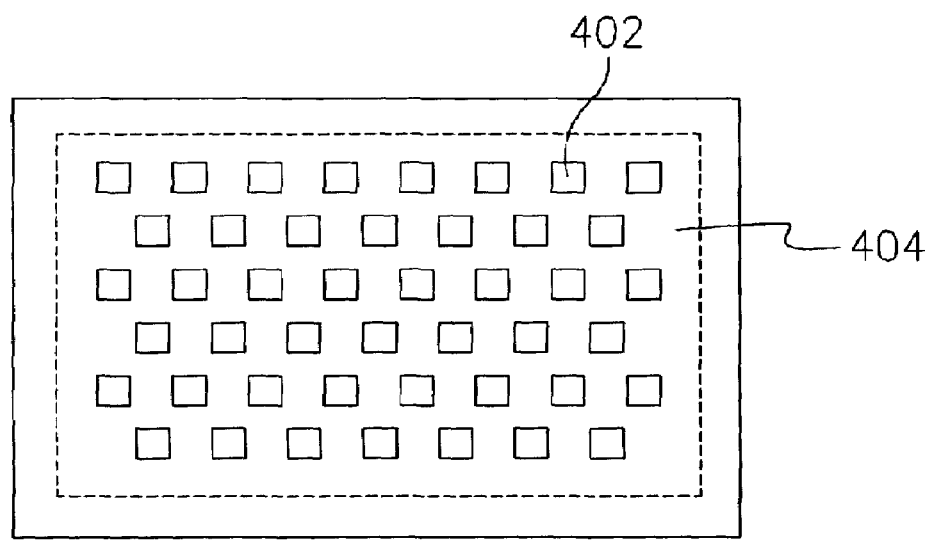

FIGS. 3 and 4 are top views showing two alternative bump layouts of a driver IC according to a first preferred embodiment of this invention. To match the ever-increasing demand for input/output (I/O) terminals in a driver IC package, the driver IC 300 of this invention is able to provide more bumps 302 in the active region. As shown in FIG. 3, the bumps 302 are positioned to form a grid array in the active region. The bumps are arranged, for example, to form a vertically aligned grid over the active region so that pressure is evenly distributed during chip-on-glass (COG) manufacturing. Circuit regions 304 are formed underneath bump space between neighboring bumps. Thus, surface area of the driver IC 300 is fully utilized so that more bumps 302 may fit into the driver IC package.

Similarly, the bumps 402 in FIG. 4 are positioned to form a grid array in the active region. However, the bumps are positioned along alternating non-aligned or staggered rows over the active region so that pressure is more evenly spread out over the driver IC 400 during COG manufacturing. Circuit regions 404 are formed underneath bump space between neighboring bumps 402. Therefore, surface area of the driver IC 400 is fully utilized so that more bumps 402 may fit into the driver IC package. Furthermore, a bump layout having a mixture of the vertically aligned grid and the alternating non-aligned row pattern is permissible depending on actual requirements.

Whatever the type of array format (grid type or alternative non-aligned row pattern) selected, more bumps may be fitted inside the driver IC package for identical bump size and bump pitch. Ultimately, the bump space between the edges of neighboring bumps is unaffected by side length of the driver IC.

Figure 5:
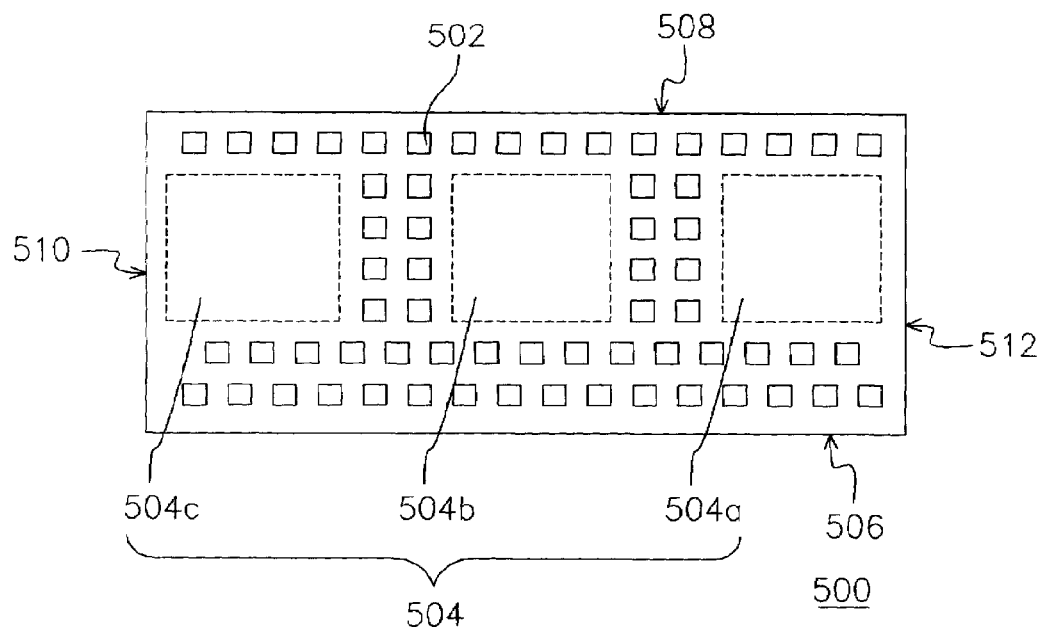
FIG. 5 is a top view showing bump layout of a driver IC according to a second preferred embodiment of this invention.

FIG. 5 is a top view showing bump layout of a driver IC according to a second preferred embodiment of this invention. As shown in FIG. 5, the driver IC 500 has an active region with four sides including a first long side 506, a second long side 508, a first short side 510 and a second short side 512. Bumps 502 close to the first long side 506 of the active region are positioned to form, for example, two alternative non-aligned rows. Bumps 502 close to the second long side 508 of the active region are positioned to form, for example, a single row. No bumps are laid within the region close to the first short side 510 or the second short side 512. In this embodiment, bumps close to the shorter sides of a conventional driver IC are moved towards the central region of the driver IC package. With this arrangement, light marking pressure on the first shorter side 510 and the second shorter side 512 during chip-on-glass (COG) manufacturing is prevented. Due to the aforementioned bump layout, circuit regions 504 are divided into several sub-circuit blocks 504a, 504b and 504c. However, these sub-circuit blocks may be linked together by forming circuit lines.

Figure 6:
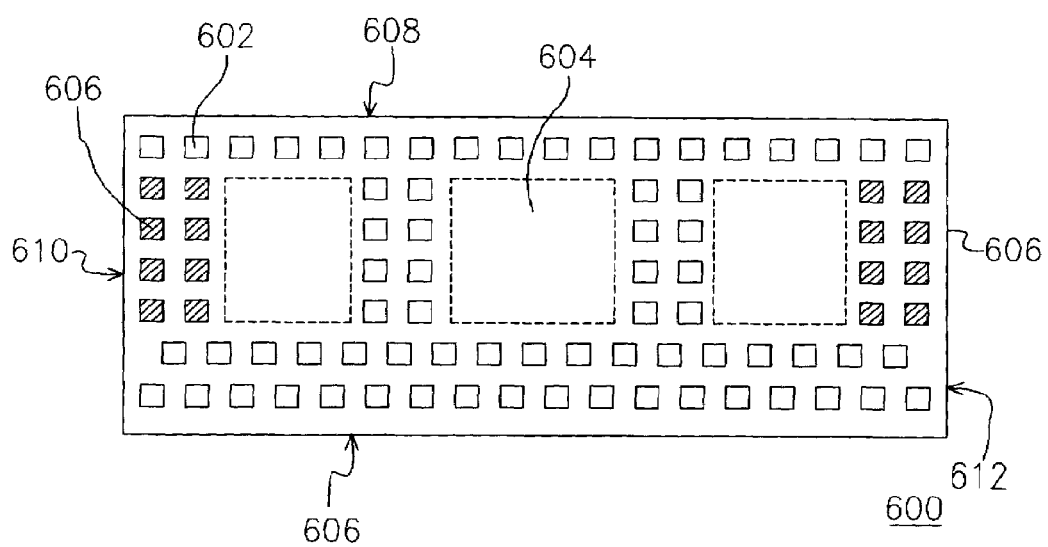
FIG. 6 is a top view showing bump and dummy bump layout on a driver IC according to a fourth preferred embodiment of this invention.

FIG. 6 is a top view showing bump and dummy bump layout on a driver IC according to a fourth preferred embodiment of this invention. The bump layout in FIG. 6 is very similar to the bump layout shown in FIG. 5. Bumps 602 close to the short sides (610 and 612) of a conventional driver IC package are also moved to a more central region of the driver IC package so that light marking pressure during COG manufacturing is prevented. However, dummy bumps 606 are also formed in the active region close to the first short side 610 and the second short side 612. In subsequent COG manufacturing operations, the dummy bumps 606 on the driver IC 600 are able to even out pressure distribution. In addition, even if light marking pressure occurs in subsequent COG manufacturing, bondage between the driver IC and glass is unaffected because the dummy bumps 606 have no electrical connection with external circuits.

Although the bump layout is explained using gate driver IC and source driver IC as example, the bump layout according to this invention has a wide spectrum of applications including COG, COF, COB and TAB manufacturing of an IC chip.

In conclusion, major advantages of the bump layout according to this invention includes: 1. More bumps are packed inside a driver IC. 2. The bump layout is able to equalize pressure distribution in many types of manufacturing including COG, COF, COB and TAB. 3. Light marking pressure on the short sides of a driver IC is eliminated after a COG, COF, COB or TAB manufacturing operation so that electrical connections are unaffected.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A bump layout on a driver integrated circuit (IC), comprising:
    a narrow and long driver IC package having an active region, wherein the package has a first short side, a second short side, a first long side and a second long side; and
    a plurality of bumps over the active region close to the first long side and the second long side and over some other part of the active region so that the active region is divided into a plurality of circuit blocks.

2. The bump layout of claim 1, wherein the bumps close to the first long side are positioned in a vertically aligned grid format.

3. The bump layout of claim 1, wherein the bumps close to the first long side are positioned in alternatively staggered row format.

4. The bump layout of claim 1, wherein the bumps close to the second long side are positioned in a vertically aligned grid format.

5. The bump layout of claim 1, wherein the bumps close to the second long side are positioned in an alternatively staggered row format.

6. The bump layout of claim 1, wherein the circuit blocks are electrically connected by circuit lines.

* * * * *